(12) United States Patent
Feng (10) Patent No.: US 7,297,916 B1
(45) Date of Patent: Nov. 20, 2007

(54) OPTICALLY IMPROVED CMOS IMAGING SENSOR STRUCTURE TO LOWER IMAGING LENS REQUIREMENTS

(75) Inventor: Chen Feng, Bothell, WA (US)

(73) Assignee: MagnaChip Semiconductor, Ltd., Chungcheongbuk-Do (KR)

( * ) Notice: Subject to any disclaimer, the term of this patent is extended or adjusted under 35 U.S.C. 154(b) by 62 days.

(21) Appl. No.: 11/064,346

(22) Filed: Feb. 22, 2005

(51) Int. Cl.
*H01L 27/00* (2006.01)
*H04N 5/225* (2006.01)

(52) U.S. Cl. .................. 250/208.1; 348/340
(58) Field of Classification Search ........... 250/208.1; 257/225; 348/340; 438/70
See application file for complete search history.

(56) References Cited

U.S. PATENT DOCUMENTS

| | | | |
|---|---|---|---|
| 5,796,154 A * | 8/1998 | Sano et al. ............... 257/432 |
| 6,111,247 A * | 8/2000 | Sengupta ................... 250/226 |
| 6,362,513 B2 * | 3/2002 | Wester ....................... 257/432 |
| 6,577,342 B1 * | 6/2003 | Wester ....................... 348/340 |
| 2003/0173599 A1 * | 9/2003 | Nakai ......................... 257/225 |
| 2004/0165097 A1 * | 8/2004 | Drowley et al. ........... 348/340 |

* cited by examiner

*Primary Examiner*—Georgia Epps
*Assistant Examiner*—Kevin Wyatt
(74) *Attorney, Agent, or Firm*—Greenberg Traurig, LLP (57) ABSTRACT

A sensor die that lowers the lens requirements by the use of a variable thickness distribution over the sensor die. The sensing portion of the sensor die has a different number of layers than the non-sensing portion of the sensor die. By reducing the thickness of each layer and/or eliminating one or more unnecessary layers in the sensing portion, the thickness of the sensing portion is reduced to lower the amount of stray light and allow an increase in chief ray angle as well as a decrease in the F-number of the imaging system coupled to the sensor die without compromising the image quality of the sensor die. Also, the thickness reduction provides the design engineers with extra allowance in handling the chief ray angle and F-number for a given lens requirements.

9 Claims, 5 Drawing Sheets

OPTICALLY IMPROVED CMOS IMAGING SENSOR STRUCTURE TO LOWER IMAGING LENS REQUIREMENTS

BACKGROUND

1. Field of the Invention

The present invention relates to CMOS image sensor design and more particularly to lowering imaging lens requirements of CMOS image sensors.

2. Background of the Related Art

There has been an increase of digital image devices using CMOS image sensors. A conventional CMOS image sensor requires a matching imaging lens unit which includes one or more lens elements to direct incoming light to its sensor surface and generate an image on the sensor. In general, the chief ray angle for a pixel at the center of the sensor surface is zero, while the chief ray angles for pixels at corners and/or edges of the sensor surface reach to a considerable amount. To mitigate the negative effects of large chief ray angles and consequently generate a uniform image over the entire sensor surface, the imaging system of the CMOS image sensor may be customized under given imaging lens requirements.

In general, the imaging lens requirements may refer to the limitations on the number of lens elements and size of the imaging lens unit (assembly). A complex imaging lens unit having multi lenses may require a complicated optical design and a high manufacturing cost. Thus, it is desirable to minimize the number of imaging lens elements without degrading the performance of the imaging system.

The overall physical dimension of the imaging system may determine the size of imaging lens unit. Thus, the lens size requirement may become more significant as the size of the imaging device decreases as in typical mobile applications. For this reason, the mobile sensor device engineers often make significant efforts to minimize the lens size without compromising the performance of the imaging system.

However, the conventional approaches to change the number of lens elements and size of the imaging lens unit in an effort to lower the lens requirements may encounter additional difficulties as these requirements may be accompanied by a considerable amount of alteration and customization of the entire CMOS image sensor layout. Thus, there is a need for an improved methodology that lowers the lens requirements without modifying the overall imaging system significantly and compromising the image quality and performance of the sensor.

SUMMARY

The present invention provides a sensor die that lowers the lens requirements by the use of a variable thickness distribution over the sensor die. The sensing portion of the sensor die has a different number of layers than the non-sensing portion of the sensor die. Also, by reducing the thickness of each layer and/or eliminating one or more unnecessary layers in the sensing portion, the thickness of the sensing portion is reduced to provide the design engineers with extra allowance in handling chief ray angles and F-number of the imaging system without compromising the image quality of the sensor die.

In one aspect of the present invention, a sensor die includes: a sensing potion having a plurality of pixels, each of the plurality of pixels having a first set of layers and a microlens; and a non-sensing portion having a second set of layers, the second set of layers having a different number of layers than the first set of layers.

In another aspect of the present invention, a sensor die formed on a substrate having a plurality of passive components includes: a sensing potion including a plurality of pixels, each of the plurality of pixels having a microlens and a first set of layers that comprises: a photodiode partially embedded on the substrate; a first insulting layer on top of the photodiode and the substrate; a plurality of metal layers on top of the first insulating layer, the photodiode and the plurality of passive components connected to at least one of the plurality of metal layers; a plurality of middle insulating layers, each of the plurality of metal layers sandwiched by corresponding two of the plurality of middle insulating layers; a passivation layer on top of the plurality of middle insulating layers; a color filter; and a planar layer on top of the color filter; and a non-sensing portion having a second set of layers, the second set of layers having a different number of layers than the first set of layers.

In yet another aspect of the present invention, an imaging device includes a sensor die that comprises: a sensing potion including a plurality of pixels, each of the plurality of pixels having a first set of layers and a microlens; and a non-sensing portion having a second set of layers, the second set of layers having at least one more layer than the first set of layers. The imaging device further includes an imaging lens unit that includes one or more lens elements to direct incoming light to the sensor die.

In still another aspect of the present invention, a sensor die includes: a sensing potion comprising a plurality of pixels, each of the plurality of pixels having a first set of layers and a microlens; and a non-sensing portion having a second set of layers, the thickness of the second set of layers being larger than that of the first set of layers.

These and other features, aspects and advantages of the present invention will become better understood with reference to the following drawings, description and claims.

DETAILED DESCRIPTION

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention should not be limited by this Detailed Description, but rather by Claims following.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that, as used herein and in the appended claims, the singular forms "a", "an", and "the" include plural referents unless the context clearly dictates otherwise. Thus, for example, reference to "a pixel" includes a plurality of such pixels, i.e., pixel array, and equivalents thereof known to those skilled in the art, and so forth.

Figure 1:
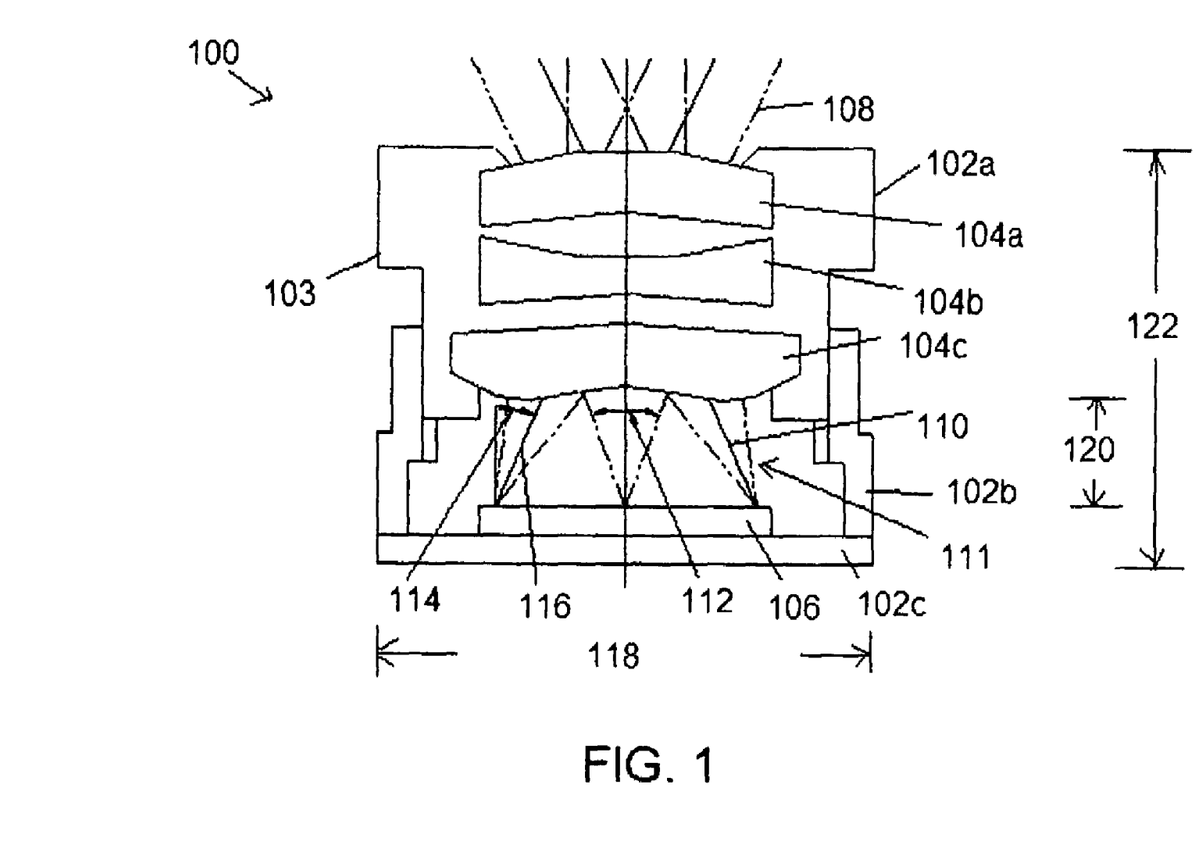
FIG. 1 is a schematic diagram of an exemplary image module assembly in accordance with one embodiment of the present invention.

FIG. 1 is a schematic diagram of an exemplary image module assembly 100 in accordance with one embodiment of the present invention. The image module assembly 100 may be included in a digital image device, such as digital image camera and cellular phone with imaging capabilities. The image module assembly 100 includes: an outer case having barrel members 102a-b and a bottom 102c; a lens unit (or, equivalently lens assembly) 103 having one or more lens elements 104a-c; and a CMOS sensor die 106. The sensor die 106 may contain more than a hundred thousand, or even more than a million pixels, and the detailed structure of the pixels will be described in connection with FIGS. 2a-b. In one embodiment, the width and length of the sensor die 108 may be about, but not limited to, 5 mm.

The lens elements 104a-c may direct incoming optical rays 108 to form an image on the sensor die 106. A chief ray 110 may be at the center of a light ray pencil 111 collected by a pixel. Likewise, a chief ray angle 114 may be defined as an angle between a normal to the surface of the sensor die 106 and a chief ray 116. The chief ray angle of the center pixel of the sensor die 106 may be zero, while that of a corner pixel (e.g., the angle 114) may be up to 25-30 degrees. As will be explained later, the chief ray angle 114 may be determined by several factors including the lens requirements. A marginal ray angle 112 may be the largest angle between two rays within a light ray pencil collected by a pixel. For simplicity, only three lens elements 104a-c are shown in FIG. 1. However, it should be apparent to those of ordinary skill that the present invention can be practiced with any number of lens elements that satisfy the limiting lens requirements specific to the module assembly 100.

As mentioned above, the lens requirement, i.e., the number of lens elements 104a-c and the size of the lens unit 103, may be closely related to the design factors of the image module assembly 100, such as, the physical dimension of the module assembly 100 (e.g., the height 122 and width 118), the chief ray angle 114, the distance 120 between the lens element 104c and surface of the sensor die 106, and the physical dimension of the sensor die 106. For example, the size of the imaging lens elements 104a-c may become the major factor limiting the module dimension. The module height 122 and footprint size may be limited by the lens size especially when the sensor resolution gets higher with a high number of imaging lens elements.

The lens requirements may also affect the chief ray angle of corner pixels and the F-number of the compound imaging lens unit 103 having the lens elements 104a-c. For example, for a fixed sensor die dimension and the distance 120, a decrease in the diameter of imaging lens elements 104a-c may yield an increase in the chief ray angle while a decrease in the number of lens elements may yield an increase in the F-number to maintain the image quality. The chief ray angle of the corner pixel (e.g., 114) may determine the image uniformity, while the F-number may determine the marginal ray angle 112, and as a consequence, the overall module sensitivity. As the major goals in module design may be maximizing the chief ray angle of corner pixels and minimizing the F-number of the compound imaging system without degrading the image quality, the imaging system design may be directed toward lowering the lens requirements. In one embodiment of the present invention, in contrast to the conventional approaches to modify the imaging lens elements 104a-c, the thickness of the sensor die 106 may be changed to generate an effect equivalent to lowering the lens requirement.

Figure 2A:
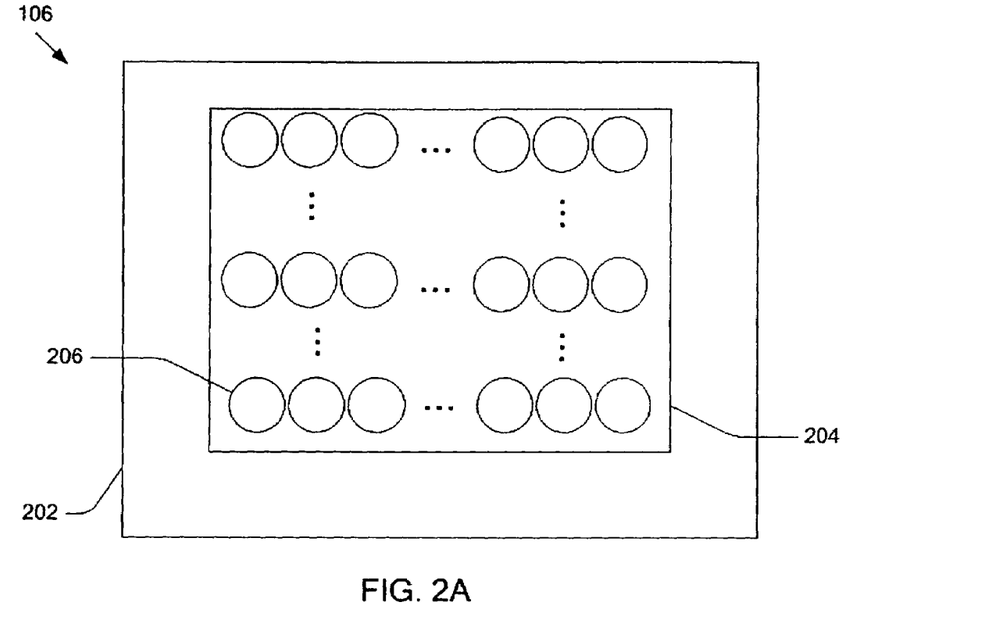
FIG. 2a is a top view of the CMOS sensor die shown in FIG. 1.

FIG. 2a is a top view of the CMOS sensor die 106 shown in FIG. 1. As illustrated in FIG. 2a, the sensor die 106 includes: a sensing portion 204 having a plurality of pixels and a non-sensing portion 204 having circuits to process the signal generated by the sensing portion 204, wherein each pixel may include a microlens 206.

Figure 2B:
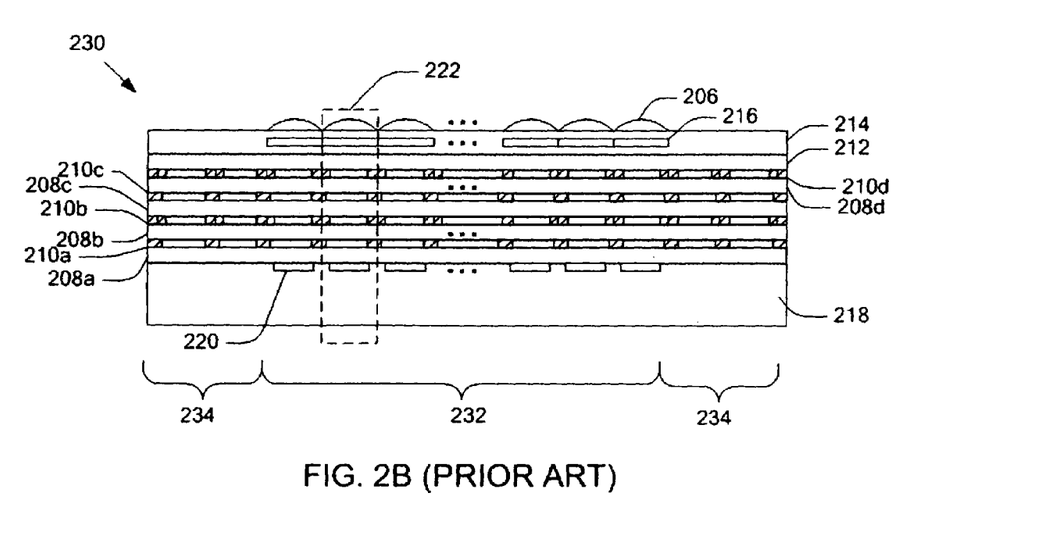
FIG. 2b is a side cross sectional view of a conventional CMOS sensor die.

FIG. 2b is a side cross sectional view of a conventional CMOS sensor die 230. As illustrated in FIG. 2b, the conventional sensor die 230 includes a sensing portion 232 and a non-sensing portion 234. The sensing portion 232 may includes a plurality of pixels 222 located on a substrate 218, preferably a silicon substrate, and each pixel includes: a photodiode 220 partially embedded in the substrate layer 218; four transparent insulating layers 208a-d; four metal layers 210a-d, the four metal layers being insulated by the four transparent insulating layers 208a-d and connected to the photodiode 220; a passivation layer 212, the passivation layer being a transparent insulating layer and having a flat top surface; a color filter 216 for transmitting a specific wavelength or wavelength band of light to the photodiode 220; a planar layer 214 for providing a flat surface; and a microlens 206 for focusing light rays to the photodiode 220. The sensor die 230 may further include a plurality of passive components (such as transistors, resistors and capacitors) partially embedded in the silicon substrate layer 218, which are not shown in FIG. 2b for simplicity. The metal layers 210a-d may function as connecting means for the photodiodes 220 and passive components to the non-sensing area of the sensor die 230, where the signals from the photodiodes and passive components may be transmitted using a column transfer method. Further details of the sensor die 230 are disclosed in U.S. patent application Ser. No. 11/004,465 entitled "Microlens alignment procedures in CMOS image sensor design" filed Dec. 2, 2004, which is hereby incorporated herein by reference in its entirety.

Each color filter 216 filters light rays directed to its corresponding photodiode 220 and transmits light rays of only one wavelength or wavelength band. In one embodiment, a RGB color system may be used, and consequently, a color filter 216 may be one of three types. In the RGB system, signals from three pixels are needed to form one complete color. However, it is noted that the number of types of filters can vary depending on the color system applied to the sensor die 230.

Figure 3A:
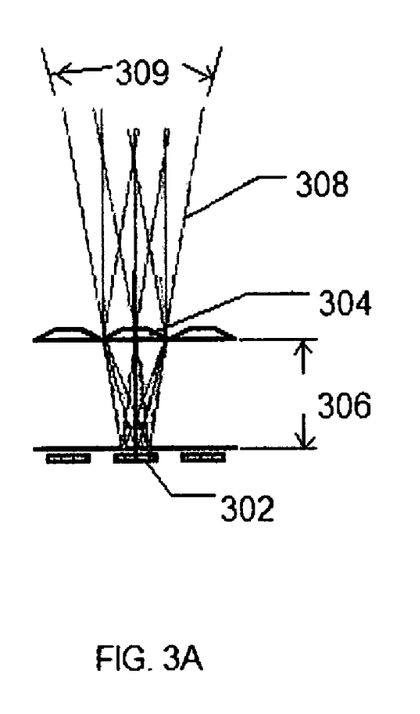
FIGS. 3a-b are schematic diagrams of a sensor die having shifted microlenses in accordance with one embodiment of the present invention.
Figure 3B:
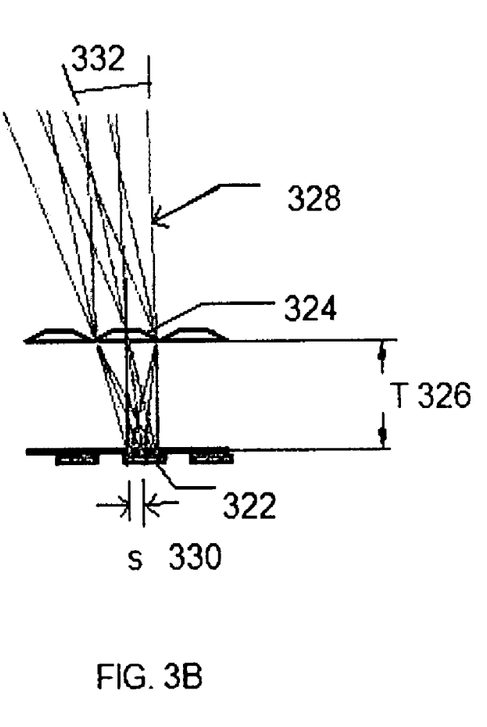

FIGS. 3a-b are schematic diagrams of the sensor die 106 having shifted microlenses in accordance with one embodiment of the present invention. In FIGS. 3a-b, only microlenses 304 and 324 and photodiodes 302 and 322 are shown for simplicity. However, it should be apparent to those of ordinary skill that other components, such as a color filter, may be inserted between the microlens 304 (or 324) and the photodiode 302 (or 322) and shifted with respect to the photodiode 302. The microlenses 304 and 324 may correspond to pixels at the center and edge of the sensor die 106, respectively. As the chief ray angle of the center pixel may equal zero, the microlens 304 may not be shifted with respect to the photodiode 302 in FIG. 3a. However, the chief ray angle 332 of the edge pixel may be up to 25-30 degrees and, as a consequence, the microlens 324 of the pixel near the edge of the sensor die 106 may be shifted by a distance S 330 to collect the light rays 328 as shown in FIG. 3b. More detailed explanation of the photodiode shifting techniques are disclosed in the previously referenced U.S. patent application Ser. No. 11/004,465 entitled "Microlens alignment procedures in CMOS image sensor design" filed Dec. 2, 2004.

The thickness T 326 may be determined by a set of parameters including the number and thicknesses of the metal layers, transparent insulating layers, passivation layer, color filter and planar layer. The distances S 330 may be calculated by the equation:

$$T * \tan \theta / n\_eq = S \quad (1)$$

where θ and n_eq represent the chief ray angle 332 and the equivalent refractive index of the layers from microlens vertex to the photodiode surface, respectively. The shift distance S 330 may decrease as the thickness T 326 decreases for a fixed chief ray angle. Likewise, for a fixed shift distance S 330, a decrease in the thickness T 326 may allow an increase in the chief ray angle 332. Thus, the stack height, or equivalently the thickness T 326, may be an ultimate limit to the chief ray angle 332.

As describe above in connection with FIG. 1, the F-number of the compound imaging system may be related to the marginal ray angle 309. For a given dimension of the photodiode 302, a decrease in the thickness T 326 may yield an increase in the marginal ray angle 309, which in turn may allow a decrease in the F-number of the compound imaging system. Thus, the thickness T 326 may be an ultimate limit to the F-number of the imaging system. As the major goals in module design may be maximizing the chief ray angle of the corner pixel and minimizing the F-number of the compound imaging system without degrading the image quality, it is desirable to decrease the thickness T 326. Also, as the maximum chief ray angle and the minimum F-number of the compound imaging system are limited by the lens requirements, the decrease in the thickness T 326 may have an effect equivalent to lowering the lens requirements.

Another advantage of thin sensor die may be realized by the use of thick microlenses. As the thickness T 326 decreases, the focal length of a microlens (e.g., 304) may decrease, and as a consequence, the thickness of the microlens may increase. In general, thicker microlenses may be fabricated with relative easy than thinner microlenses. Furthermore, the surface roughness of the thicker microlenses may have less negative effect on the image intensity than the thinner microlenses.

Figure 4A:
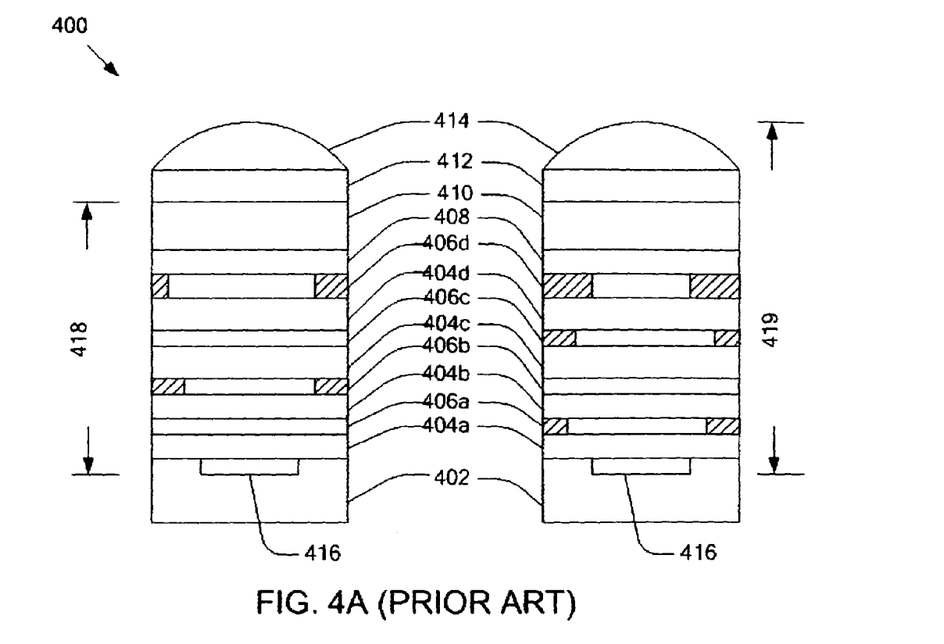
FIG. 4a is a schematic diagram of an exemplary embodiment of a conventional sensor pixel.

FIG. 4a is a schematic diagram of an exemplary embodiment 400 of the conventional sensor pixel 222 (shown in FIG. 2b). The sensor pixel 400 may be on a substrate 420 and include: a photodiode 416; four transparent insulating layers 404a-d; four metal layers 406a-d, the four metal layers being insulated by the four transparent insulating layers 404a-d and connected to the photodiode 416; a passivation layer 408, the passivation layer being a transparent insulating layer and having a flat top surface; a color filter 410 for transmitting a specific wavelength or wavelength band of light to the photodiode 416; a planar layer 412 for providing a flat surface; and a microlens 414 for focusing light rays to the photodiode 416. Typically, the thicknesses 418 and 419 may be about 7 and 10 microns, respectively.

Figure 4B:
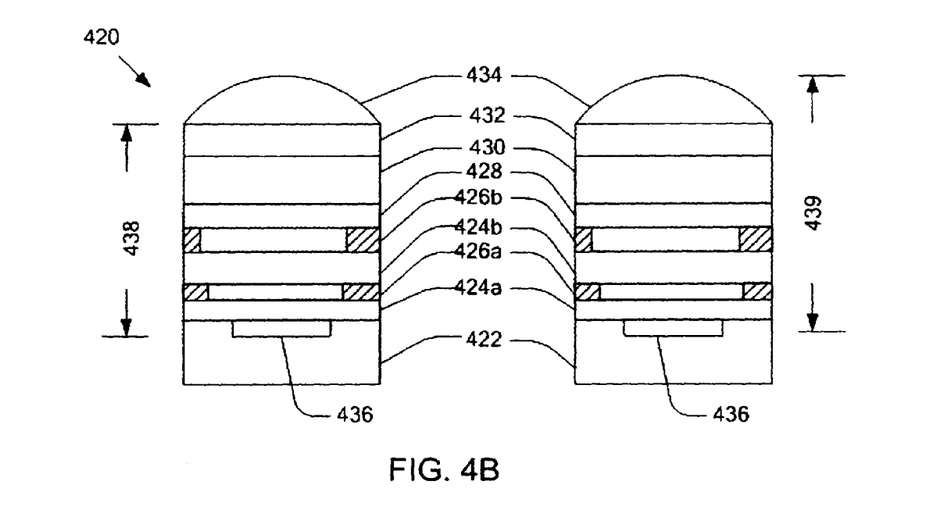
FIG. 4b is a schematic diagram of an exemplary embodiment of a sensor pixel in accordance with one embodiment of the present invention.

FIG. 4b is a schematic diagram of an exemplary embodiment 420 of a sensor pixel in accordance with one embodiment of the present invention. The sensor pixel 420 includes: a photodiode 436; two transparent insulating layers 424a-b; two metal layers 426a-b; a passivation layer 428, the passivation layer being a transparent insulating layer and having a flat top surface; a color filter 430 for transmitting a specific wavelength or wavelength band of light to the photodiode 436; a planar layer 432 for providing a flat surface; and a microlens 434 for focusing light rays to the photodiode 436. The sensor die 420 may be similar to the sensor pixel 400 except a difference that the sensor pixel 420 has a smaller number of metal and insulating layers to reduce its thickness. The thicknesses 438 and 439 may be about, but not limited to, 3 and 5 microns, respectively. In one embodiment, to reduce the thicknesses 438 and 439 further, the thickness of each layer of the pixel 420 may be decreased. In FIG. 4b, only two metal layers and two insulating layers are shown for simplicity. However, it is noted that the present invention may be practiced with any number of metal and insulting layers.

Figure 5:
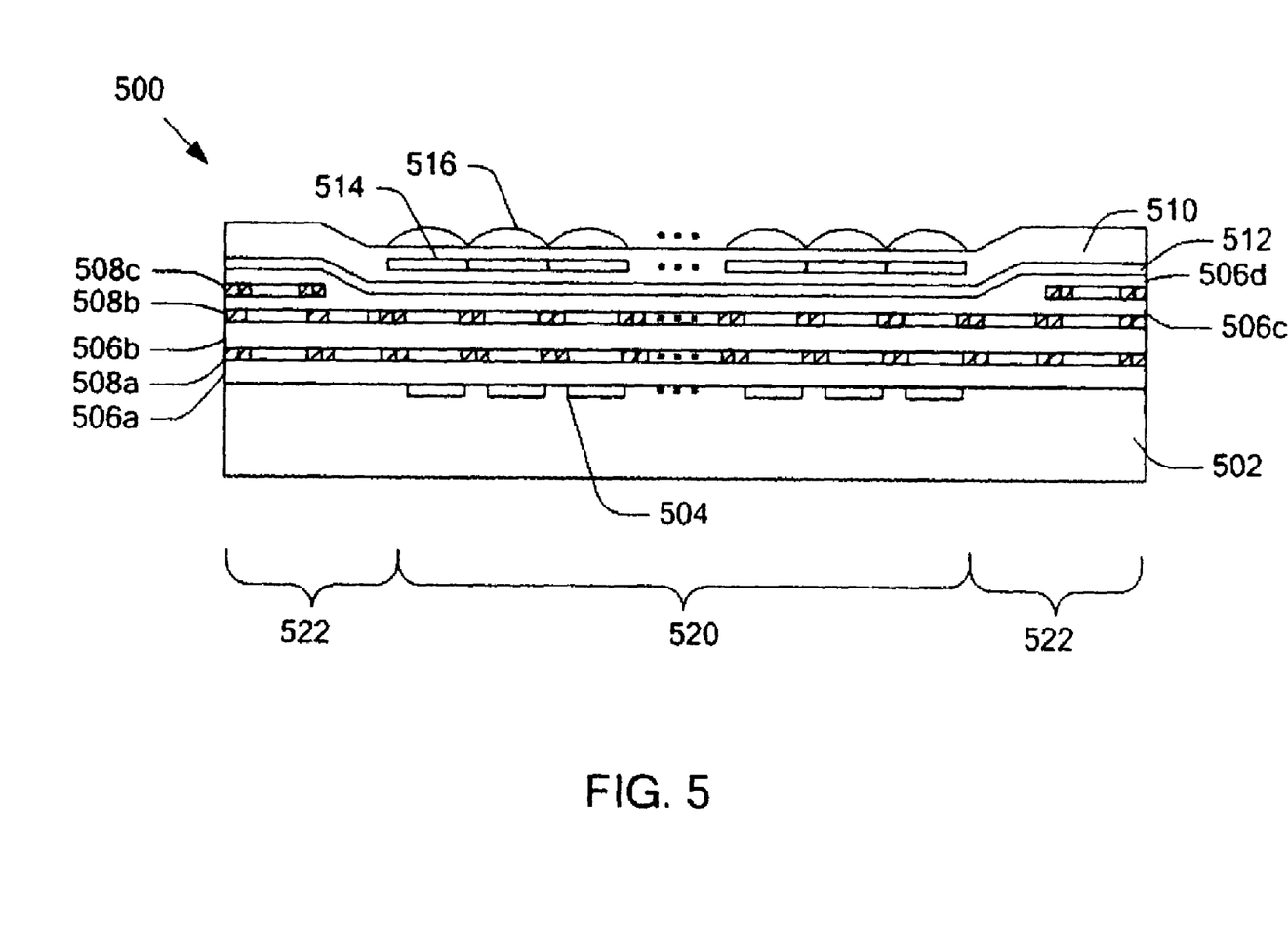
FIG. 5 is a side cross sectional view of an exemplary embodiment of a sensor die in accordance with one embodiment of the present invention.

FIG. 5 is a side cross sectional view of an exemplary embodiment 500 of a sensor die in accordance with one embodiment of the present invention. As illustrated in FIG. 5, the sensing portion 520 of the sensor die 500 may have a smaller number of metal and transparent insulating layers than the non-sensing portion 522. The sensing portion 520 includes: a substrate 502; photodiodes 504; two metal layers 508a-b; three transparent insulating layers 506a-c; a passivation layer 512; a planar layer 510; color filters 514; and microlenses 516. The non-sensing portion 522 may include: the substrate 502; three metal layers 508a-c; four transparent insulating layers 506a-d; the passivation layer 512; and the planar layer 510. In one embodiment, the two insulating layers 506a and 506d may be made of one dielectric material.

Typically, as illustrated in FIG. 2b, each layer of the conventional sensor die 230 may have a uniform thickness distribution over the portions 232 and 234. Thus, in a conventional sensor die 230, some of the layers may be required by only one of the two portions 232 and 234, and become unnecessary to the other. For example, the non-sensing portion 522 may require a metal layer 508c coupled to a plurality of passive components (such as transistors, resistors and capacitors) embedded in the substrate 502, which are not shown in FIG. 5 for simplicity. As the sensing portion 520 may not need the metal layer 508c, a corresponding part of the metal layer 508c may be eliminated as illustrated in FIG. 5.

In general, the top metal layer of a conventional sensor die 404d may be configured to reduce the amount of stray light that otherwise would be collected by the photodiode 416 and its neighboring photodiodes. However, by eliminating unnecessary layers, the thickness 418 may be reduced, and as a consequence, the amount of stray light may be reduced to make the top metal layer 418 dispensable. In FIG. 5, the sensor die 500 does not have a metal layer configured to block the stray light, which may further reduce the thicknesses 438 and 439. In one embodiment, the number of imaging lens elements 104a-c for a VGA (640×480 resolution) system may be reduced from 3 to 2, where the number of imaging lens elements for multi mega pixel system may be reduced from 4 to 3. In another embodiment, the lens diameter and thickness may be decreased by at least 15%.

As explained in connection with FIGS. 3a-b, a decrease in stack height may allow an increase in the maximum chief ray angle of corner pixels and a decrease in the minimum F-number of compound imaging system. Typically, the maximum chief ray angle and the minimum F-number of a conventional sensor die may be about 15-20 degrees and 2.8-3.5, respectively. In one embodiment, a reduced stack height may allow the maximum chief ray angle of 25-30 degrees and the minimum F-number of 1.7-2.5, respectively.

For clarity explanation, only three metal layers are shown in FIG. 5. However, it should be apparent to those of ordinary skill that the present invention may be practiced with any number of metal layers. Also, it is should be apparent to those of ordinary skill that the difference in the number of layers between the sensing and non-sensing portions can vary without deviating from the present teachings.

Those skilled in the art will appreciate that the methods and designs described above have additional applications and that the relevant applications are not limited to those specifically recited above. It should be understood that the foregoing relates to exemplary embodiments of the invention and that modifications may be made without departing from the spirit and scope of the invention as set forth in the following claims.

What is claimed is:

1. A sensor die comprising:
   a sensing portion including a plurality of pixels, each of the plurality of pixels having a first set of layers and a microlens;
   a non-sensing portion around an outside border of the plurality of pixels having a second set of layers, the second set of layers having a different number of layers than the first set of layers and wherein a thickness of the second set of layers is larger than a thickness of the first set of layers to reduce size of the sensor die, wherein the sensing and non-sensing portions are formed on a substrate having a plurality of passive components; and
   wherein the first set of layers includes:
   a photodiode partially embedded on the substrate;
   a first insulating layer on top of the photodiode and the substrate;
   a plurality of metal layers on top of the first insulating layer, the photodiode and the plurality of passive components coupled to at least one of the plurality of metal layers;
   a plurality of middle insulating layers, each of the plurality of metal layers sandwiched by corresponding two of the plurality of middle insulating layers;
   a passivation layer on top of the plurality of middle insulating layers;
   a color filter; and
   a planar layer on top of the color filter,
   wherein an optical axis of the microlens and an optical axis of the color filter are shifted with respect to an optical axis of the photodiode and wherein the microlens is configured to direct incoming light to the photodiode.

2. A sensor die formed on a substrate having a plurality of passive components, comprising:
   a sensing portion including a plurality of pixels, each of the plurality of pixels having a microlens and a first set of layers that comprises:
   a photodiode partially embedded on the substrate;
   a first insulating layer on top of the photodiode and the substrate;
   a plurality of metal layers on top of the first insulating layer, the photodiode and the plurality of passive components connected to at least one of the plurality of metal layers;
   plurality of middle insulating layers, each of the plurality of metal layers sandwiched by corresponding two of the plurality of middle insulating layers;
   a passivation layer on top of the plurality of middle insulating layers;
   a color filter; and
   a planar layer on top of the color filter; and
   a non-sensing portion around an outside border of the plurality of pixels having a second set of layers, the second set of layers having a different number of layers than the first set of layers and wherein a total thickness of the second set of layers is larger than a total thickness of the first set of layers to reduce size of the sensor die.

3. The sensor die of claim 2, wherein an optical axis of the microlens and an optical axis of the color filter are shifted with respect to an optical axis of the photodiode.

4. The sensor die of claim 2, wherein the second set of layers includes at least one more layer than the first set of layers and wherein the at least one more layer is a metal layer, an insulating layer, or any combination thereof.

5. The sensor die of claim 2 wherein thickness of the first and second sets of layers is about 4 microns.

6. The sensor die of claim 2, wherein the device is a digital camera or a cellular phone with an imaging capability.

7. The sensor die of claim 2, wherein the color filter passes light of one color selected from the group consisting of red, green and blue.

8. The sensor die of claim 1, wherein the second set of layers includes at least one more layer than the first set of layers and wherein the at least one more layer is a metal layer, an insulating layer, or any combination thereof.

9. The sensor die of claim 1, wherein the color filter passes light of one color selected from the group consisting of red, green and blue.

* * * * *

UNITED STATES PATENT AND TRADEMARK OFFICE
CERTIFICATE OF CORRECTION

| | | |
|---|---|---|
| PATENT NO. | : 7,297,916 B1 | Page 1 of 1 |
| APPLICATION NO. | : 11/064346 | |
| DATED | : November 20, 2007 | |
| INVENTOR(S) | : Chen Feng | |

It is certified that error appears in the above-identified patent and that said Letters Patent is hereby corrected as shown below:

Column 8, line 19

Please change "plurality of middle insulating layers, each of the plu-" to read -- a plurality of middle insulating layers, each of the plu- --

Signed and Sealed this

Eighth Day of April, 2008

JON W. DUDAS
*Director of the United States Patent and Trademark Office*